United States Patent [19]
Liu et al.

[11] Patent Number: 5,922,214
[45] Date of Patent: Jul. 13, 1999

[54] NANOMETER SCALE FABRICATION METHOD TO PRODUCE THIN FILM NANOSTRUCTURES

[75] Inventors: Gang-yu Liu, Detroit, Mich.; Song Xu, Windsor, Canada

[73] Assignee: Wayne State University, Detroit, Mich.

[21] Appl. No.: 08/785,734

[22] Filed: Jan. 17, 1997

[51] Int. Cl.$^6$ ................................ G03F 9/00; G03F 7/00
[52] U.S. Cl. ..................... 216/2; 430/5; 355/71
[58] Field of Search ................ 216/2; 430/5; 427/523; 554/79; 437/180

[56] References Cited

U.S. PATENT DOCUMENTS

| | | | |
|---|---|---|---|
| 4,728,591 | 3/1988 | Clark et al. | 430/5 |
| 4,952,026 | 8/1990 | Bellman et al. | 350/167 |
| 5,110,760 | 5/1992 | Hsu | 437/180 |
| 5,290,960 | 3/1994 | Singh | 554/79 |
| 5,294,465 | 3/1994 | Gallagher | 427/523 |
| 5,352,485 | 10/1994 | De Guire et al. | 427/226 |
| 5,514,501 | 5/1996 | Tarlov | 430/5 |
| 5,596,434 | 1/1997 | Walba et al. | 349/123 |
| 5,609,907 | 3/1997 | Natan | 427/2.12 |
| 5,629,214 | 5/1997 | Crosby | 436/518 |
| 5,630,932 | 5/1997 | Lindsay et al. | 205/645 |
| 5,635,047 | 6/1997 | Porter et al. | 204/421 |
| 5,666,190 | 9/1997 | Quate et al. | 355/71 |
| 5,686,548 | 11/1997 | Grainger et al. | 528/25 |
| 5,696,207 | 12/1997 | Vargo et al. | 525/326.2 |

OTHER PUBLICATIONS

Liu, G. et al, 1994, Langmuir, vol. 10, pp. 367–370, Am. Chemical Society.
Langmuir, vol. 12, 3252–3256, Chen (1996)—Nanografting of N–Vinyl–2–pyrrolidone Molecules on a Graphite Surface with a Scanning Tunneling Microscope.
J. Am. Chem. Soc., vol. 105, No. 13, 4481–4483, Nuzzo (1983)—Adsorption of Bifunctional Organic Disulfides on Gold Surfaces.
J. Am. Chem. Soc., vol. 111, 321–335, Bain (1989)—Formation of Monolayer Films by the Spontaneious Assembly of Organic Thiols from Solution onto Gold.
J. Am. Chem. Soc., vol. 114, 9188–9189, Kumar (1992)—The Use of Self–Assembled Monolayers and a Selective Etch to Generate Patterned Gold Features.
Chem. Mater., vol. 6, No. 5, 596–602, Abbott (1994)–Using Micromachining, Molecular Self–Assembly, and Wet Etching to Fabricate 0.1–1–μ–Scale Structures oi Gold & Silicon.
Langmuir, vol. 10, 367–370, Liu (1994)—Reversible Displacement of Chemisorbed n–Alkanethiol Molecules on Au(111) Surface: An Atomic Force Microscopy Study.

*Primary Examiner*—James C. Housel
*Assistant Examiner*—Ginny Allen Portner
*Attorney, Agent, or Firm*—Dykema Gossett PLLC

[57] ABSTRACT

A method for fabricating thin film nanostructures is provided. A layer of material on a substrate is mechanically displaced using an atomic force microscopy tip. The displacement is carried out in a fluid containing molecules which rapidly enter the void created by the AFM tip and bind to the clean substrate surface. These molecules are spatially confined in the void created by the displacement and form inlaid structures within the surrounding material. The surrounding material can be removed to create islands of the new material. The method is particularly adapted for use in fabricating nanometer-scale microelectronic devices.

18 Claims, 5 Drawing Sheets

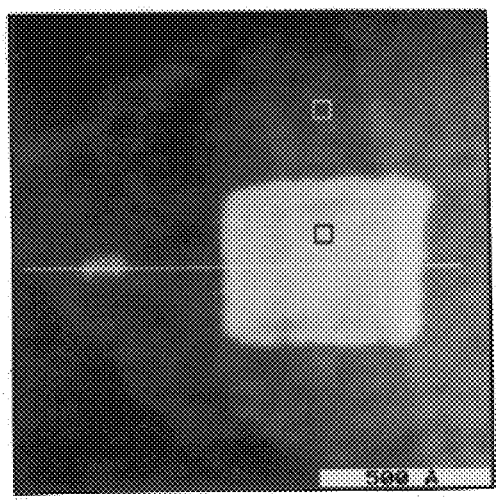
FIG. 4
FIG. 5
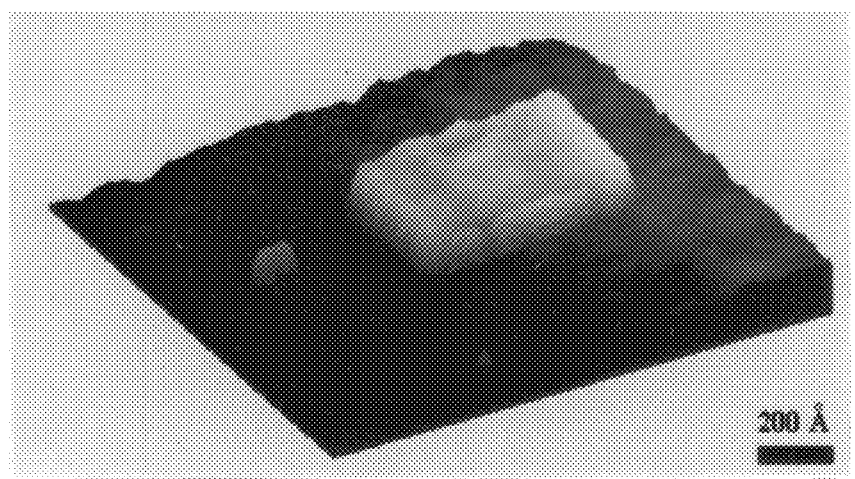
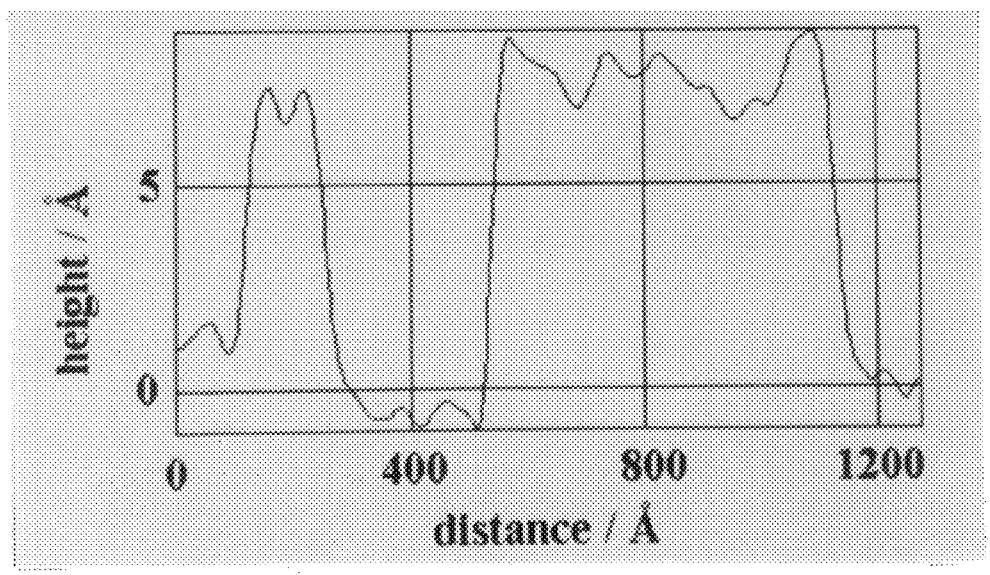
FIG. 6

NANOMETER SCALE FABRICATION METHOD TO PRODUCE THIN FILM NANOSTRUCTURES

TECHNICAL FIELD

The present invention relates generally to thin film materials and more specifically to techniques for fabricating nanometer scale structures.

BACKGROUND OF THE INVENTION

The growth of the microelectronics industry has in large part been made possible by rapid advances in microfabrication technologies. Through miniaturization of microelectronic structures, the number of devices which can be placed on an integrated circuit has increased exponentially for several decades. This increase in packing density has led to the development of smaller, faster and more affordable microelectronic devices. Due to a number of limitations of conventional fabrication techniques, however, device miniaturization faces a number of obstacles. For example, as circuit designers further reduce the size of various structures, traditional photolithography techniques are limited by the wavelength of the light and the manufacture of masks which are used for patterning. Accordingly, alternative techniques have been explored for fabrication of microelectronics as well as other thin-film devices such as microelectrodes and microsensors and the like.

While microtechnology is relatively mature, development of nanotechniques attracts more and more attention. In nanotechnology, nanometer or molecular-scale structures are fabricated. "Nanoetching" generally includes those techniques which are used to remove material from a substrate to create a nanoscale structure, for example, a nanometer-scale groove or trench. "Molecular nanotechnology" often refers to the fabrication of nanometer-scale, three dimensional structures by the assembly of individual molecules. "Nanografting" has been used to describe the deposition of a material with nanometer dimensions to a substrate. Regardless of the nomenclature, it is clear that for device miniaturization to reach its full potential, fabrication methods must satisfy the resolution requirements of industry and must become a commercial reality.

In "Nanografting of N-Vinyl-2-Pyrrolidone Molecules on a Graphite Surface with a Scanning Tunneling Microscope", Langmuir, Vol. 12, 3252–3256, Chen, et al. disclose the use of a scanning tunneling microscopy tip to induce grafting of NVP molecules on a graphite surface from a solution of NVP. At high bias voltages, pits or holes were formed in the surface of the graphite substrate and islands of NVP (or its derivatives) were deposited in the pits from solution. The islands were reportedly of nanometer scale.

A number of organic molecules are known to self-assemble spontaneously on certain substrates. These self-assembled monolayers (SAMs) are essentially oriented monolayers with head groups chemically attached to the substrate and end groups exposed at the interface. In "Adsorption of Bifunctional Organic Disulfides on Gold Surfaces, J. Am. Chem. Soc., Vol. 105, No. 13, 1983, the entire disclosure of which is incorporated herein by reference, Nuzzo, et al. disclose the preparation and structural characterization of supported monolayer assemblies of oriented organic molecules by adsorption of thiols and disulfides on gold substrates. The self assembly of long-chain alkanethiols was further investigated by Bain et al. as disclosed in "Formation of Monolayer Films by the Spontaneous Assembly of Organic Thiols form Solution onto Gold", J. Am. Chem. Soc. Vol. 111, 321–335 (1989), the entire disclosure of which is incorporated herein by reference. Therein, it was disclosed that long-chain alkanethiols, $HS(CH_2)_nX$, adsorb from solution onto gold surfaces and form ordered, oriented monolayers.

It is also known that these self-assembled monolayers can be patterned using electron beams, metastable argon beams, photolithography and scanning probe microscopy. In addition, two or more self-assembled monolayers on gold have been patterned with a resolution of from 0.1 micron to 100 microns by microcontact printing, micromachining and microwriting. In "The Use of Self-Assembled Monolayers and a Selective Etch to Generate Patterned Gold Features", J. Am. Chem. Soc. Vol. 114, 9188–9189 (1992), Kumar et al. disclose the use of self-assembled monolayers as a resist on gold film to block etching using a solution KOH and KCN. In addition, a monolayer SAM on a gold film substrate was micromachined and etched to form a trench in the gold layer. In "Using Micromachining, Molecular Self-Assembly, and Wet Etching to Fabricate 0.1–1 micron Scale Structures of Gold and Silicon", Chem Mater, Vol. 6, No. 5 (1994), Kumar et al. further describe this machining technique. Therein, a monolayer of $HO(CH_2)_2S$ was chemisorbed on the surface of a gold film on a glass substrate. Grooves of 0.1–1.0 micron were then machined in the adsorbed layer with the tip of a surgical blade or the cut end of a carbon fiber. Bare gold was exposed in the grooves, Kumar et al. disclose that the dimensions of the micromachined regions of bare gold were influenced by both the shape of the machining tip and the size of the mechanical load applied to the tip. The third step of patterning was the immersion in a SAM of $CH_3(CH_2)_{15}S$. It was reported that the SAM molecules self-assembled on the exposed gold. The areas of gold film covered by the $HO(CH_2)_2S$ were then selectively etched to remove the $HO(CH_2)_2S$ and the underlying gold. Kumar et al. state that the procedure can be scaled to dimensions of less than 10 nanometers by using scanning tunneling microscopy and atomic force microscopy to micromachine SAMS formed on the surface of metal films.

In "Reversible Displacement of Chemisorbed n-Alkanethiol Molecules on AU(111) Surface: An Atomic Force Microscopy", Langmuir, Vol. 10, 367–370 (1994), the entire disclosure of which is incorporated by reference, one of the present inventors discloses that Atomic Force Microscopy (AFM) can be used to displace a preselected region of a SAM on a gold substrate and that after removal of the applied load the displaced region is restored. This reversible displacement was demonstrated independently with SAMs formed from $CH_3(CH_2)_9SH$ and from $CH_3(CH_2)_{17}SH$.

Thus, there exists a need for a method of forming higher resolution, e.g. nanometer or molecular scale, patterns within the plane of an adsorbate on a substrate.

SUMMARY OF THE INVENTION

In one aspect, the present invention provides a method of forming nanometer-scale structures by mechanically displacing a layer of a first material on a substrate in the presence of a solution of self-assembling molecules. As the first material is displaced, a clean nanometer-scale void is created. The self-assembling molecules enter the void in the first material and self-assemble on the substrate. The self-assembling structure is laterally confined during the displacing/assembly process. This method provides precise control of the size and geometry of the fabricated features. Edge resolution of greater than 2 nm can be achieved. The fabricated nanostructures can be rapidly changed, modified and characterized in situ.

In another aspect, the method of the present invention is carried out by providing a substrate selected from the group of precious metals, e.g. Au, Ag, Cu and Pt. A layer of a first material is attached to the outermost surface of a substrate. This layer is then immersed into a solution with a second material. The second material is of a different chemical composition than the first material. A region of the layer of first material is then displaced via an atomic force microscopy tip in the solution of the second material. This effectively creates a groove or space in the first layer, thereby exposing the underlying substrate to the solution containing the second material. The molecules from the solution immediately fill the newly created groove or void, form a chemical bond with the substrate, i.e. self-assemble within the confines of the groove. The layer on the substrate thus becomes a composite of the second material inlaid in the first material. In other words, the self-assembly occurs in a localized region or regions.

In still another aspect, the method of the present invention further includes the step of removing, through the use of a chemical enchant or the like, the first material such that the regions of second material remain as elevated regions or plateaus on the substrate. The selective etching is due to the fact that the thickness of the second material is larger than the first and chemically more resistant to certain reagents.

In still another aspect, the substrate may be composed of semiconductor, insulator or other material and has an overlying coating of a material such as a metal. In order to selectively etch the surface coating of the substrate, following formation of the self-assembled regions, the first material, and those regions of the substrate coating underlying the first material, are removed. In this aspect the self-assembled layer may serve as a mask which protects the substrate coating from the etchant.

In still another aspect, the solution containing the self-assembled molecules can be replaced at any desired time. For instance, after fabrication of a nanostructure, the solution can be replaced with a third material, and repeating the nanoshaving/self-assembly process thereby results in additional self-assembled structures of a different chemical composition. Alternatively, by replacing the solution with a solution of the first material, the previous nanostructures can be modified, erased, or changed.

In still another aspect, atomic force microscopy is utilized to characterize in situ the surface of the composite layer formed through the nanoshaving/self-assembly process.

BRIEF DESCRIPTION OF THE DRAWINGS

FIG. 4 is an atomic force microscopy image showing the surface topography of two fabricated $C_{18}S$ nanoislands (brighter areas) inlaid in the matrix $C_{10}S$ monolayer.

FIG. 5 is a three dimensional view of FIG. 4.

FIG. 6 is the cross-sectional profile as indicated in the white line in FIG. 4.

DETAILED DESCRIPTION OF THE PREFERRED EMBODIMENTS OF THE INVENTION

Figure 1:
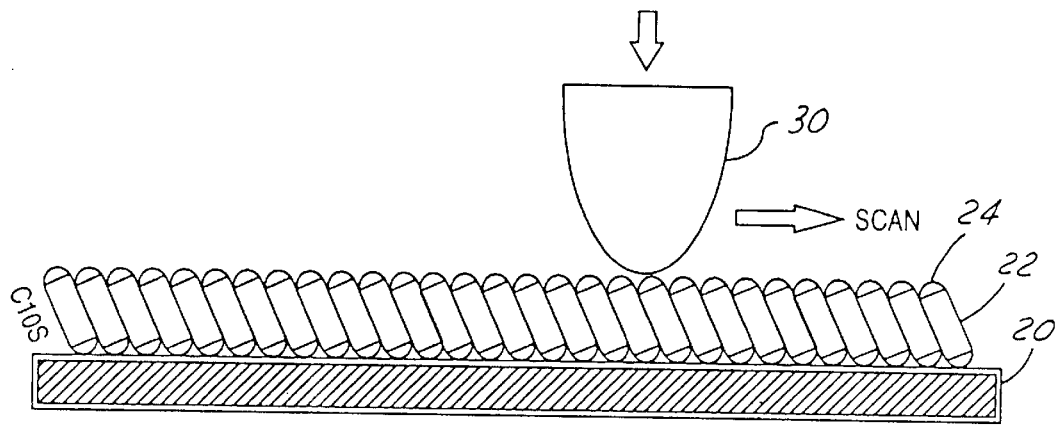
FIG. 1 is a diagram illustrating the use of an atomic force microscopy to characterize the structure of a monolayer of $CH_3(CH_2)_9SH$ on gold substrate.

Referring now to FIG. 1 of the drawings, substrate 20 is shown having a principal surface 22 on which layer or molecular matrix 24 is disposed. In this embodiment substrate 20 is gold and principal surface 22 is the outmost gold surface, Au (111). A number of metal or non-metal substrates may be suitable for use in the present invention so long as they can serve as an attachment site for self-assembling molecules as will be explained more fully hereinafter. For example, preferred substrates for use in the present invention are Au, Ag, Cu, and Pt. Surface preparation for application of layer 24 is routine as will be appreciated by those skilled in the art and comprises any number of cleaning/surface preparation techniques.

Layer 24 in the illustrated embodiment is a monolayer of $C_{10}$ thioalkanes (also referred to herein as alkanethiols), specifically, $CH_3(CH_2)_9SH$, which as will be appreciated by those skilled in the art is a self-assembling molecule on gold. Preferred materials for forming layer 24 in accordance with the present invention are alkanethiols having the formula $HS(CH_2)_nX$, where n is an integer between 2 and 30 and X is a functional group. The functional group X may vary widely depending on the desired properties, for example susceptibility/resistance to a particular etchant. By way of example and not limitation, X may be COOH, OH, $NH(CH_3)$, $N(CH_3)_2$, $NH_2$, $CF_3$, $OCH_3$, F, Cl and COOR, where R represents organic functional groups in general, e.g. hydrocarbon or flurocarbons. Also, although preferred, it is not necessary that layer 24 be a self-assembling molecule. Other suitable materials for use as layer 24 are Langmuir-Blodgett films and polymer coatings. While it is preferred that layer 24 be a monolayer, multiple layers or other aggregations may be suitable or desired on a particular application.

It will be recognized by those skilled in the art that layer 24 may be formed on substrate 20 using a variety of techniques. One preferred method is simply by preparing a solution of the alkanethiols in butanol or some other suitable solvent such as ethanol, methanol or water and immersing substrate 20 therein.

As shown in FIG. 1 of the drawings the surface integrity of layer 24 can be characterized by atomic force microscopy at a small image force (load) of 0.5 nN. It is a feature of the invention that the same apparatus used to fabricate structures in the present invention, preferably an atomic force microscopy tip, can also be used to immediately characterize the structure so formed with molecular resolution.

Figure 2:
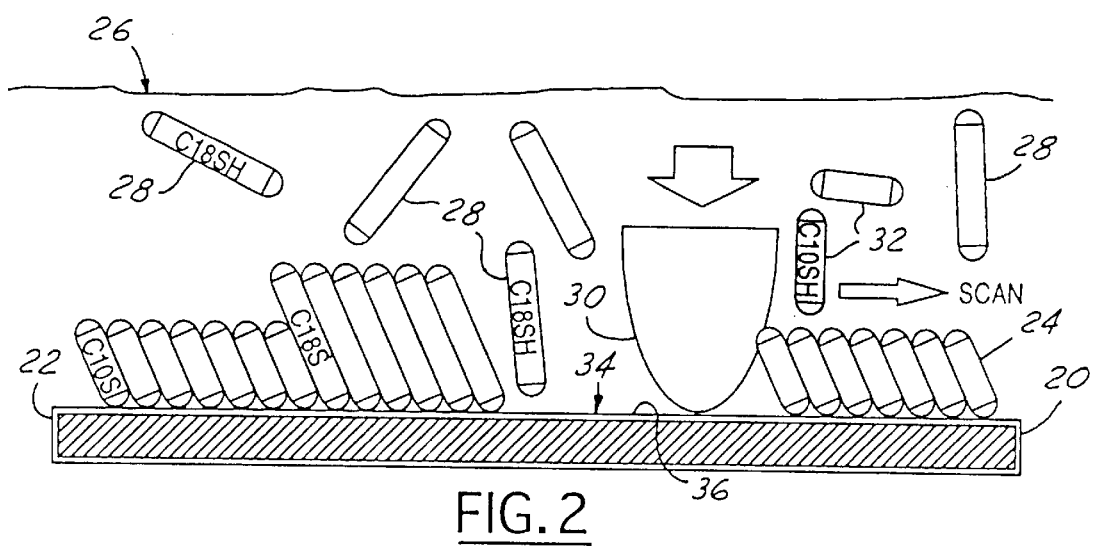
FIG. 2 is a diagram illustrating the use of an atomic force microscopy tip as a nanoshaver to displace the $CH_3(CH_2)_9SH$ monolayer from the selected region(s), while the $CH_3(CH_2)_{17}SH$ molecules self-assembly from solution to the newly exposed gold substrate.

Referring now to FIG. 2 of the drawings, in the next step of the present invention, substrate 20 having monolayer 24 disposed thereon is placed in a fluid which may be a gas vapor, but which is preferably liquid solution 26 of a self-assembling molecules 28, shown here as $C_{18}SH$. In the present invention the structures to be fabricated are formed from self-assembling molecules in solution 26. Preferred materials for self-assembling molecules 28 are alkanethiols having the formula $HS(CH_2)_nX$, where n is an integer between 2 and 30 and X is a functional group. The functional group X may vary widely depending on the desired properties: for example X may be selected from the group consisting of COOH, OH, $NH(CH_3)$, $N(CH_3)_2$, $NH_2$, $CF_3$, $OCH_3$, F, Cl and COOR, where R represents organic functional groups in general, e.g. hydrocarbons or flurocarbons, and combinations thereof. Other X functional groups may be suitable in a particular application. Suitable non-thiol self-assembling molecules for use in the present invention as molecules 28 are siloxane/$SiO_2$ such as $CH_3 (CH_2)_{17}SiO_2$, $SiO_2$, and $CF_3 (CF_2)_nSiO_2$, $SiO_2$, where $n$ is an integer between 2 and 30.

Most preferably, molecules 28 are provided in solution 26 with an organic solvent such as butanol, although other solvents such as ethanol or methanol may be acceptable in other applications. The concentration of self-assembling molecules 28 in solution 26 may vary widely, however, a concentration of from about 0.01 to about 0.03% by weight in butanol or a similar solvent will be appropriate in many applications. Most preferably solution 26 will be applied in the form of a bath into which substrate 20 and monolayer 24 are immersed.

The temperature of solution 26 will typically be room temperature, e.g. between about 20 to 32 degrees C and will typically be at ambient laboratory conditions. Higher (or lower) temperatures would speed up (or slow down) the reaction without affecting the quality of the layer. There is generally no need to agitate solution 26 during the process.

As stated above, and referring now to FIG. 2 of the drawings, in the present invention an atomic force microscopy tip is used to displace a portion of layer 24 to expose principal surface 22 of substrate 20. Accordingly, a V-shaped cantilever beam (not shown) will have tip 30, usually pyramidal $Si_3N_4$, attached thereto. A quadrant photodiode detector permits simultaneous measurement of the normal deflection and lateral torsion. As will be appreciated by those skilled in the art, the value of the normal force or load includes capillarity contribution and the force acting on the surface due to cantilever bonding. The magnitude of the capillary force can be determined by measuring the force versus distance dependence during an approach and retract cycle. The details of construction and operation of a suitable atomic force microscopy apparatus is described by Kolbe et.al. in Ultramicroscopy 1992, 42–44, 1113, the entire disclosure of which is incorporated herein by reference.

In order to displace layer 24, sufficient force at tip 30 is used to remove molecules 32 in the desired area. This will typically be from about 1 to about 5 nN. The precise force required will be a function of the strength of the attachment of layer 24 to substrate 20. In essence, tip 30 is effectively "plowing" through layer 24 to create a channel or void 34. The size of void 34 will depend upon the geometry of the structure to be formed, but in the case of a single pass of tip 30 through layer 24 the width of void or channel 34 will typically be from about 1 to about 15 nm. It will be appreciated that multiple adjacent passes of tip 30 through layer 24 can be used to create wider structures. Where layer 24 is a monolayer as illustrated in the drawings, the depth of void 34 will be the height of the monolayer. It may be desirable to utilize an array of tips 30 in some applications, particularly for automation.

Figure 3:
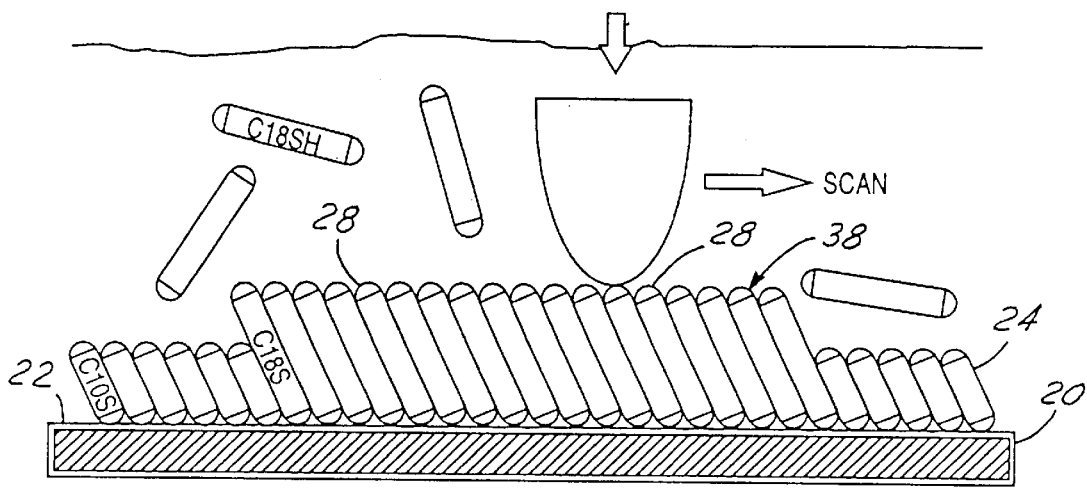
FIG. 3 is a diagram illustrating the use of atomic force microscopy to characterize the fabricated nanostructures of $CH_3(CH_2)_{17}SH$ inlaid in $CH_3(CH_2)_9SH$ monolayer.

Referring now to FIGS. 2 and 3 of the drawings, as void 34 is created by tip 30, self-assembling molecules 28 immediately enter void 34 and attach to region 36 of principal surface 22 of substrate 20. In other words, molecules 28 which are in solution self-assemble on the exposed surface of substrate 20 following the track of tip 30. Thus, principal surface 22 is less subject to contamination than with self-assembly on a wide-open substrate since clean substrate surface is produced and then instantly exposed to the thiol solution during the scan under high force. Tip 30 acts in essence as a "nanoshaver."

Figure 7:
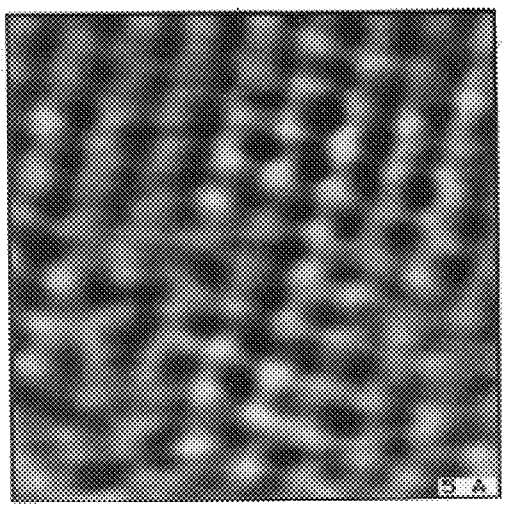
FIG. 7 is a high resolution (50×50 square angstrom) atomic force microscopy image of the white square in FIG. 4.
Figure 8:
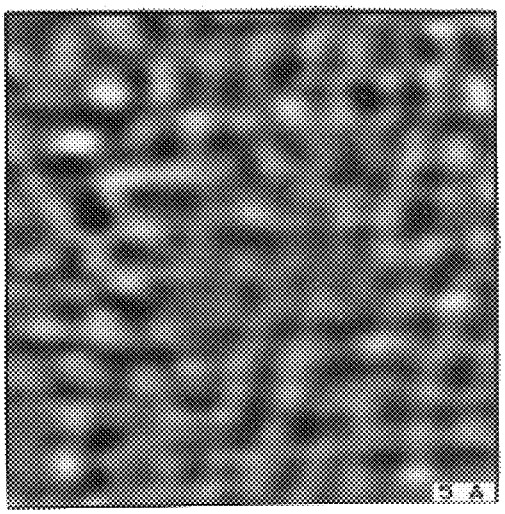
FIG. 8 is a high resolution (50×50 square angstrom) atomic force microscopy image of the black square in FIG. 4.
Figure 9:
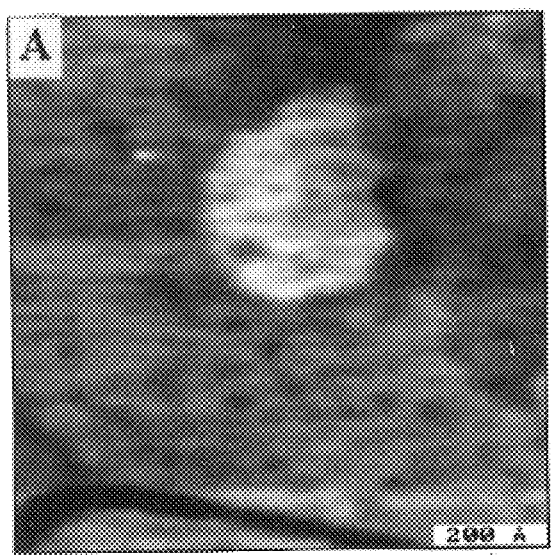
FIG. 9 is an atomic force microscopy image of a $C_{10}SH$ monolayer on a gold surface before fabrication.
Figure 10:
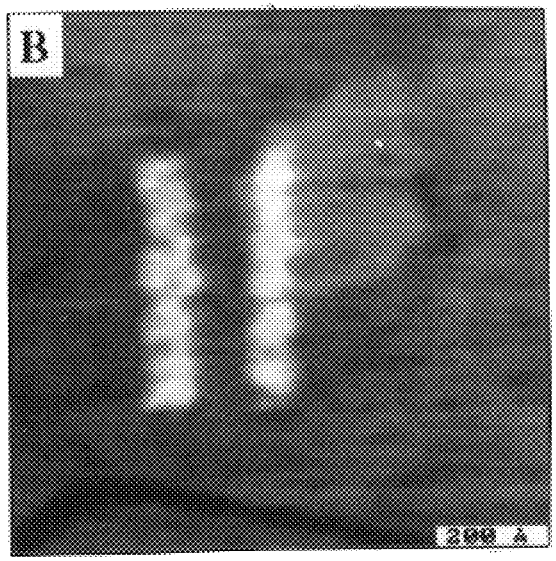
FIG. 10 is an atomic force microscopy image of two parallel $C_{18}S$ nanolines fabricated with the dimensions of 10×50 $nm^2$, with a separation of 20 nm.
Figure 11:
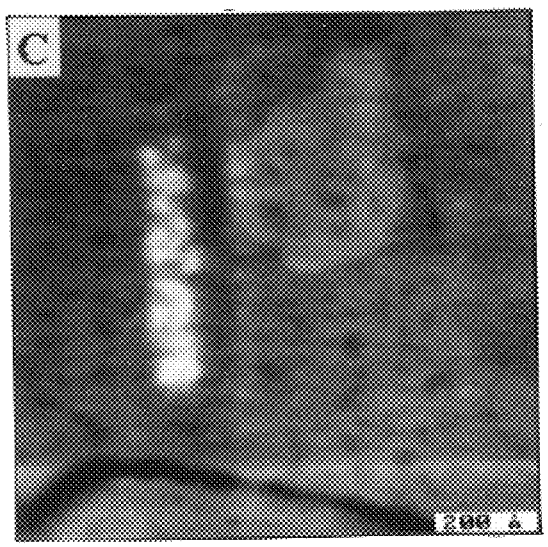
FIG. 11 is an atomic force microscopy image of the surface of FIG. 10 after erasure of one line by scanning the nanoline area under high imaging force in a $C_{10}SH$ solution.
Figure 12:
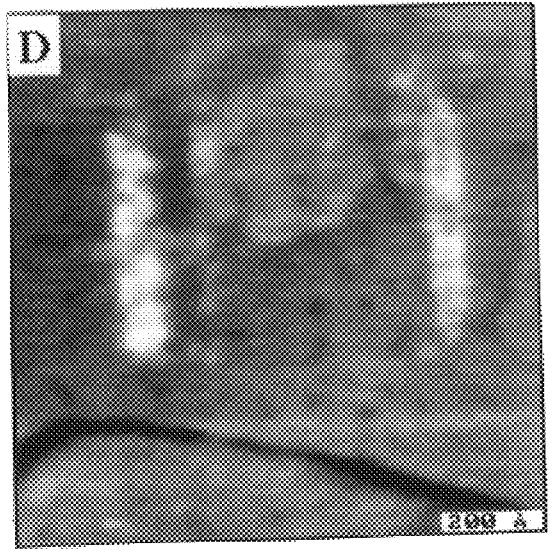
FIG. 12 is an atomic force microscopy image of the surface of FIG. 11 after refabrication of the second line by a scanning under high imaging force in $C_{18}$,SH solution. The interline spacing now is increased to 60 nm.

It will be appreciated that the walls of layer 24 which define void or channel 34 serve to spatially confine region 36 of principal surface 22 and thus confine self-assembling molecules 28 as they attach and align on substrate 20. It is believed that this confinement results in a somewhat different adsorption pathway, at least in the case of alkanethiols, than that which has been observed on an open substrate. Self-assembling molecules 28 appear to orient directly into a typically 27 degrees tilt from surface normal (principal surface 22) in the present invention. Accordingly, and still referring to FIG. 3 of the drawings, self-assembling molecules 28 are closely packed and well-ordered to form island 38. Island 38 may be crystalline, polycrystalline or amorphous, with the preferred alkanethiols forming crystalline islands 38, as illustrated in FIGS. 4, 7 and 8.

A number of devices can be fabricated using the methods of the present invention. One such device is a nanometer-scale capacitor where the self-assembled islands form the capacitor elements, as will be described more fully in connection with the examples set forth below.

Thus, it will now be appreciated that the present invention has several advantages over lithography and other microfabrication techniques. These advantages include that edge resolution of 2 nm can be routinely obtained and molecular precision is more easily obtained with a sharp tip. Also, nanostructures can be characterized with molecular resolution and in situ using the same AFM tip. Moreover, once set up, one can quickly change or modify the fabricated patterns in situ without changing masks or repeating the entire fabrication procedure. The present invention is particularly well adapted for use in fabricating nanoelectronic devices and may also be useful in the study of spatially confined chemical reactions.

EXAMPLES

The following examples are provided to more fully illustrate the present invention.

Example I

Fabrication of Two $CH_3(CH_2)_{17}SH$ Nanoislands Inlaid in $CH_3(CH_2)_9SH$ Monolayer 1. Preparation of cold substrate.

The substrate, 1500 angstroms gold on mica, was prepared using a high vacuum metal evaporator (Denton). Gold slug was thermally heated and vaporized in vacuum. The gold atoms were then deposited on a piece of mica, which was heated and maintained at 350 degrees Celsius during the evaporation.

2. Preparation of self-assembled monolayer matrix.

The gold substrate in step 1 was cooled down to room temperature after evaporation and taken out of vacuum, then immediately soaked in a 1-Decanethiol $CH_3(CH_2)_9SH$ ethanol solution for 24 hours or longer at room temperature, ambient laboratory conditions.

3. Nanofabrication.

A home constructed state-of-the-art atomic force microscope was used to perform the structural characterization and fabrication. The atomic force microscope tip was purchased from Park Scientific Instrument with a force constant of 0.1 nN.

First the matrix layer, $C_{10}S$ gold, was imaged via AFM with a low imaging force of 0.3 nN in a 2-butanol solution containing $C_{18}SH$. The total volume of the 2 butanol in the liquid cell is 1 ml. At the image force of 5.2 nN (higher than the displacement force threshold of 5.1 nN), $C_{10}S$ molecules can be displaced during the scan, and $C_{18}SH$ molecules (0.003% in weight) self-assemble on the exposed gold surface. The resulting nanofeature of $C_{18}S$ can be imaged by AFM at a low imaging force, e.g. 0.3 nN. Under these conditions, gold substrate is not deformed. Typical time to complete the above procedure is approximately five minutes.

FIG. 4 display atomic force microscopy images of the final products—two fabricated $C_{18}S$ nanoislands (brighter areas) inlaid in the matrix $C_{10}S$ monolayer. The steps, shown more clearly in FIG. 5, are due to the single atomic step of Au(111). As shown in the cursor profile in FIG. 6, the $C_{18}S$ islands are 8.8 A higher than the surrounding $C_{10}S$ monolayer, consistent with the theoretical value for crystalline-phased SAMS. Molecular-resolution images ($50 \times 50 A^2$) acquired from $C_{10}S$ (white square in FIGS. 4 and 6) and $C_{18}S$ (black square in FIG. 4) covered areas are shown in FIGS. 7 and 8.

Example II

Example of Fabrication of a Nanometer Scale Capacitor(s)

1. Gold Thin Film Deposition.

Gold thin film, 200 angstroms, would be deposited, onto the gap between two electrodes, where a nanocapacitor is intended to be fabricated.

2. Preparation of self-assembled monolayer.

The metal coated substrate would be soaked by $CH_3(CH_2)_9SH$ in ethanol solution with concentration of 0.02% in weight.

3. Fabrication.

An AFM tip, or an array of AFM tips, would be applied on the selected fabrication area, while the surface of this area is in contact with a $CH_3(CH_2)_{17}SH$ in ethanol solution with concentration of 0.04% in weight. With a control device, the AFM tip(s) scan on the surface under high force, to "draw" the shape of the designed capacitor electrode, for example, two groups of arrays of closely inter-digital islands with connections within the group while separate with each other.

4. Etching.

After the fabrication of the patterns of $CH_3(CH_2)_{17}S$ self-assembled monolayer, the surface would be processed in the solution of KOH and KCN in air, while the gold covered with $CH_3(CH_2)_9S$ self-assembled monolayer is etched away, and the gold covered with $CH_3(CH_2)_{17}S$ self-assembled monolayer area is protected by the longer chain layer leaving the gold as the electrodes of the capacitor.

5. Passivation

Figure 13:
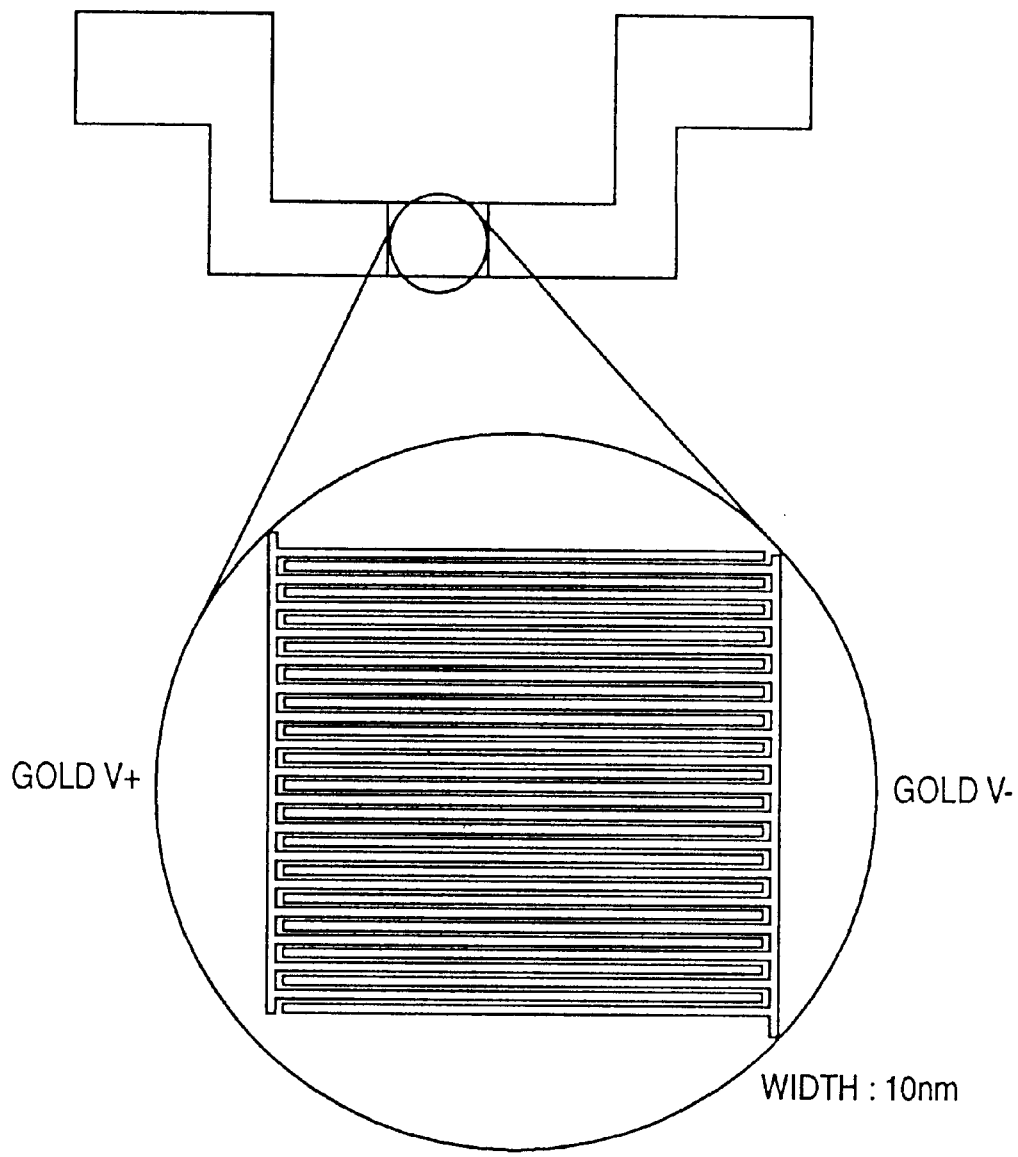
FIG. 13 is a diagram showing a possible device, a nanocapacitor fabricated using the present invention and chemical etching.

The fabricated gold electrodes could be passivated with insulating material, for example, organic polymer materials. FIG. 13 illustrates a diagram of a proposed capacitor. By using this technique, the density of the electrodes of the capacitor could be as high as 50 electrodes per micron, and the inter-electrode distance as small as 10 nanometer, which a very high capacity device could be built in a much smaller area.

What is claimed is:

1. A method of fabricating a nanometer scale two dimensional pattern on a substrate, comprising the steps of:
   providing a substrate having a principal surface;
   forming a mono layer of a first material on said principal surface said first material including first self assembling molecules
   contacting said layer of first material with a liquid containing a second material, said second material including second self-assembling molecules and wherein said second material is chemically distinct from said first material; and
   mechanically displacing a nanometer scale region of said layer of said first material while said layer is in contact with said second material to expose a portion of said principal surface of said substrate such that said second material self-assembles on said principal surface in place of said displaced first material by a spatially confined surface reaction to form a composite layer on said substrate.

2. The method recited in claim 1, wherein said layer of said first material is formed of self-assembling molecules.

3. The method recited in claim 1, wherein said mechanical displacement of said region of said layer of said first material is achieved by applying a load through an atomic force microscopy tip wherein said load is sufficient to mechanically displace said layer of said first material without deforming said principal surface.

4. The method recited in claim 1, wherein said second material is an alkanethiol having the formula $HS(CH_2)_nX$, where n is an integer from 2 to 30 and X is a functional group selected from the groups consisting of COOH, OH, $NH(CH_3)$, $N(CH_3)_2$, $NH_2$, $CF_3$, $OCH_3$, F, Cl and COOR, where R is a hydrocarbon or flurocarbon compound.

5. The method recited in claim 1, wherein said first material is an alkanethiol having the formula $HS(CH_2)_nX$, where n is an integer from 2 to 30 and X is a functional group selected from the group consisting of COOH, OH, $NH(CH_3)$, $N(CH_3)_2$, $NH_2$, $CF_3$, $OCH_3$, F, Cl and COOR, where R is a hydrocarbon or flurocarbon compound.

6. The method recited in claim 1, wherein said substrate is a metal selected from the group consisting of Au, Ag, Cu, Pt and Ni.

7. The method recited in claim 1, further including the step of removing said first material.

8. The method recited in claim 7, wherein said first material is removed by contacting said first material with an etchant which selectively removes said first material but not said second material or said substrate.

9. The method recited in claim 1, wherein said composite layer is a monolayer.

10. The method recited in claim 1, wherein said first material is $CH_3(CH_2)_9SH$ and said second material is $CH_3(CH_2)17SH$.

11. The method recited in claim 1, further comprising the steps of contacting said composite layer with a solution containing a third material, said third material including self-assembling molecules, and mechanically displacing a portion of said composite layer such that said third material adsorbs by said spatially confined surface reaction on said substrate in place of said displaced portion of said composite layer.

12. The method recited in claim 1, wherein said substrate is a gold film overlying a body of silicon or glass, said gold film forming said principal surface, and further including the steps of removing said first material and said gold film immediately underlying said first material and subsequently removing said second material such that said gold film is patterned.

13. The method recited in claim 3, further comprising the step of characterizing said composite layer using said atomic force microscopy tip.

14. The method recited in claim 1, wherein said displaced region is 1 nm or greater.

15. The method recited in claim 4, further comprising the step of changing said functional group after said composite layer is formed.

16. The method recited in claim 1, wherein said layer of said first material is a monolayer and said second material is a monolayer formed by said spatially confined surface reaction.

17. The method recited in claim 11, further comprising the steps of contacting said composite layer with a fluid containing said third material and mechanically displacing a region of said self-assembled second material to expose a portion of said principal surface of said substrate such that said third material self-assembles on said principal surface in place of said displaced second material.

18. The method recited in claim 11, wherein said third material is the same as said first material in order to change said two dimensional pattern.

* * * * *